(12) United States Patent
Kanamori

(10) Patent No.: US 7,692,237 B2
(45) Date of Patent: Apr. 6, 2010

(54) SEMICONDUCTOR MEMORY DEVICE

(75) Inventor: Kohji Kanamori, Kanagawa (JP)

(73) Assignee: Nec Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/892,278

(22) Filed: Aug. 21, 2007

(65) Prior Publication Data

US 2008/0048248 A1     Feb. 28, 2008

(30) Foreign Application Priority Data

Aug. 22, 2006   (JP)   ............... 2006-225170

(51) Int. Cl.
*H01L 29/792*   (2006.01)
(52) U.S. Cl. ............... 257/324; 257/E29.309
(58) Field of Classification Search ......... 257/314–316, 257/324, 330, E29.309
See application file for complete search history.

(56) References Cited

U.S. PATENT DOCUMENTS

| 6,580,630 | B1* | 6/2003 | Liu et al. ............... 365/106 |
| 7,202,523 | B2* | 4/2007 | Forbes ............... 257/324 |
| 2003/0222294 | A1* | 12/2003 | Yoshino ............... 257/298 |
| 2005/0042813 | A1* | 2/2005 | Nishizaka ............... 438/201 |
| 2006/0183271 | A1* | 8/2006 | Forbes et al. ............... 438/128 |
| 2007/0287290 | A1* | 12/2007 | Maurelli et al. ............... 438/691 |
| 2007/0290256 | A1* | 12/2007 | Kuo ............... 257/324 |

FOREIGN PATENT DOCUMENTS

| JP | 2003-332474 | 11/2003 |
| JP | 2004-88055  | 3/2004  |

OTHER PUBLICATIONS

Eli Lusky et al. [2002], "Electron Retention Model for Localized Charge in Oxide-Nitride-Oxide (ONO) Dielectric." IEEE Electron Device Letters, vol. 23, No. 9.

* cited by examiner

*Primary Examiner*—Nathan W Ha
(74) *Attorney, Agent, or Firm*—McGinn IP Law Group, PLLC

(57) ABSTRACT

Provided is a highly reliable multi-bit memory cell capable of miniaturization including: a semiconductor substrate with a channel formed therein; diffusion layers arranged at two sides of the channel, for serving as source/drain; an insulating film arranged on a part of the channel; a trap film made of an insulating material having an electron trapping characteristic, arranged on the semiconductor substrate, the diffusion layers and the insulating film, and including trap regions each capable of trapping electrons in at least areas in contact with the semiconductor substrate at two sides of the insulating film; and a gate electrode arranged on the trap film. The trap regions are also formed on side surfaces of the insulating film, and the trap film has a structure in which the trap film is bent upward from the surface of the semiconductor substrate in the trap regions due to the insulating film.

7 Claims, 7 Drawing Sheets

EMBODIMENT 1

EMBODIMENT 1

X-X'

EMBODIMENT 1

EMBODIMENT 1

EMBODIMENT 1

EMBODIMENT 1

EMBODIMENT 1

EMBODIMENT 1

EMBODIMENT 1

EMBODIMENT 1

EMBODIMENT 1

EMBODIMENT 1

SEMICONDUCTOR MEMORY DEVICE

BACKGROUND OF THE INVENTION

1. Field of the Invention

The present invention relates to a semiconductor memory device including a non-volatile memory cell.

2. Description of Related Art

A MONOS (Metal Oxide Nitride Oxide Semiconductor) transistor is a kind of a non-volatile memory cell (see Eli Lusky et al. [2002], "Electron Retention Model for Localized Charge in Oxide-Nitride-Oxide (ONO) Dielectric." *IEEE Electron Device Letters*, vol. 23, No. 9., which will be hereinafter referred to as "Non-patent Document 1"). In the MONOS transistor, diffusion layers 102a and 102b serving as source/drain regions are formed on the two outer sides of a part of a semiconductor substrate 101 which is a channel region, and a gate electrode 104 is formed above the part of the semiconductor substrate 101 which is the channel region with a gate insulating film 103 interposed between the gate electrode 104 and the channel region (see FIG. 7). The gate insulating film 103 is a laminated layer (ONO layer) obtained by superposing a silicon oxide film 103a, a silicon nitride film 103b and a silicon oxide film 103c in this sequence, and is formed to be level with the channel region. In a case where a write operation is performed on this MONOS transistor, predetermined voltages are applied to the semiconductor substrate 101, the gate electrode 104, the diffusion layers 102a and 102b. Thereby, electrons are trapped in a trap region 105 mainly in a vicinity of a boundary between the drain (the diffusion layer 102a or the diffusion layer 102b) and the channel region in the silicon nitride film 103b.

The MONOS transistor described in Non-patent Document 1 has a structure which enables the silicon nitride film 103b to trap electrons throughout its entire surface opposite to the channel region. For this reason, if the MONOS transistor is miniaturized too much, one trap region 105 in a vicinity of the source region and another trap region 105 in a vicinity of the drain region are constructed too close to each other, and the trapped electrons accordingly interfere with one another. This brings about a problem that the reliability deteriorates. In addition, parts of the trapped electrons diffuse in directions in which the channel region extends (in the right and left directions in the figure) due to heat and the like. As a result, density of trapped electrons in the trap regions 105 becomes lower (in a later stage) when a time has passed since a write operation than (in an earlier stage) immediately after the write operation. This leads to fluctuation of the threshold value. This fluctuation brings about a disadvantage that the long-term reliability deteriorates (see FIG. 8).

For the purpose of compensating the disadvantage, Japanese Patent Application Laid-open Publication No. 2003-332474 (hereinafter referred to as "Patent Document 1") has disclosed a semiconductor memory device characterized by including: a semiconductor substrate 211; a gate insulating film 212 formed on the semiconductor substrate 211; a single-layered gate electrode 213 formed on the gate insulating film 212; two charge retaining parts 261 and 262 formed at the two sides of a side wall of the single-layered gate electrode 213; two diffusion regions 217 and 218 corresponding to the charge retaining parts 261 and 262, respectively; and a channel region arranged under the single-layered gate electrode 213. The semiconductor memory device is also characterized in that each of the charge retaining parts 261 and 262 has a structure in which a silicon nitride film 215 for accumulating electrons is interposed between silicon oxide films 214 and 216. The charge retaining parts 261 and 262 are configured to change an amount of electric current which is going from the diffusion region 217 to the diffusion region 218, according to an amount of electrons retained in the silicon nitride film 215, when a voltage is applied to the gate electrode 213 (see FIG. 9). However, this semiconductor memory device has a disadvantage that a gate voltage controlling characteristic deteriorates in the trap region so that an electric current driving capability needed for fast readout cannot be sufficiently exerted. This is because the semiconductor memory device has a structure in which the gate electrode 213 does not overlap the trap regions (offset regions 242).

For the purpose of pursuing the miniaturization and preventing the electric current driving capability from deteriorating, Japanese Patent Application Laid-open Publication No. 2004-88055 (hereinafter referred to as "Patent Document 2") has disclosed a semiconductor device characterized by including an MIS transistor including: a semiconductor substrate 310 with a trench TR1 in its surface; a source region 311s formed in the semiconductor substrate 310 in a way that the source region 311s faces the surface of the semiconductor substrate 310; a drain region 311d formed in the semiconductor substrate 310 so as to face the surface of the semiconductor substrate 310, and to be away from the source region 311s with the trench TR1 interposed in between; a gate insulating film 320 formed on a portion interposed between the source region 311s and the drain region 311d so as to enter the trench TR1; and a gate electrode 330 formed on the gate insulating film 320 so as to enter the trench TR1. The semiconductor memory device is also characterized in that a first and second charge retaining parts capable of retaining charges CH1 and CH2, respectively, are formed in the gate insulating film 320 with the trench TR1 interposed between the first and second charge retaining parts (see FIG. 10). By forming the channel region into a concave shape, the semiconductor memory device is intended to be miniaturized, and to prevent the electric current driving capability from deteriorating. Nevertheless, the length LG of the channel is so long that the semiconductor memory device is not suitable for fast readout. In addition, density of trapped electrons can not be prevented from decreasing in the charge retaining parts (trap regions) due to heat or the like. This brings about a disadvantage that the threshold voltage fluctuates to a large extent.

SUMMARY OF THE INVENTION

A first aspect of the present invention is a semiconductor memory device including a non-volatile memory cell, the semiconductor memory device characterized by including: a semiconductor substrate in which a channel region is formed; diffusion regions, arranged at two sides of the channel region, for serving as source/drain regions; an insulating film arranged on a part of the channel region; a trap film made of an insulating material having an electrons trapping characteristic, the trap film arranged on the semiconductor substrate, the diffusion regions and the insulating film, the trap film including trap regions each capable of trapping electrons in at least areas at two sides of the insulating film, and the two sides being contiguous with the semiconductor substrate; and a gate electrode arranged on the trap film. The semiconductor memory device is also characterized in that the trap regions are formed on side surfaces of the insulating film as well.

A second aspect of the present invention is a semiconductor memory device including a non-volatile memory cell, the semiconductor memory device characterized by including: a semiconductor substrate; a source region and a drain region which are formed in the semiconductor substrate, and which extend in a first direction; a channel region interposed between the source region and the drain region in the semiconductor substrate; a first insulating film which juts out from the level surface of the semiconductor substrate, which covers a part of the channel region, and which extends in the first direction; a second insulating film covering the source region, the drain region, the first insulating region, and parts of the channel region which are not covered with the first insulating film; and a gate electrode extending in a direction perpendicular to the first direction.

A third aspect of the present invention is a semiconductor memory device, comprising: a semiconductor substrate; first and second diffusion layers formed on said semiconductor substrate, said first and second diffusion layers being separated from each other so that the top surface of said semiconductor substrate includes first, second and third portions continuously in that order from said first to second diffusion layers, the top surface of said first and second diffusion layers and the top surface of said first to third portions being coplanar; an insulating film formed on said second portion of said semiconductor substrate; a trap film formed on said first diffusion layer, said first portion, the side surfaces and top surfaces of said insulating film, said third portion and said second diffusion layer, said trap film on said first and second portions being able to trap electrons to store a data; and a gate electrode formed on said trap film.

The present invention causes no electrons to be trapped in the insulating film during a write operation which traps electrons in the trap regions. This makes it possible to prevent electrons trapped in the trap regions from interfere with each other. Accordingly, the semiconductor memory device is capable of being miniaturized, and of having a high reliability.

In addition, while parts of trapped electrons are going to diffuse due to heat or the like, step parts in the trap regions in the trap film is capable if checking the parts of the trapped electrons from diffusing toward the center of the channel region. At this time, electrons are localized in the step parts in the trap regions. These trap regions are capable of less fluctuating the threshold voltage than trap regions each with a flat structure. This makes it possible to realize the long-term reliability.

In addition, the present invention does not bring about a disadvantage of the deterioration of the electric current driving capability or the like. That is because the gate electrode overlaps the entire trap regions.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENT

Embodiment 1

Figure 1:
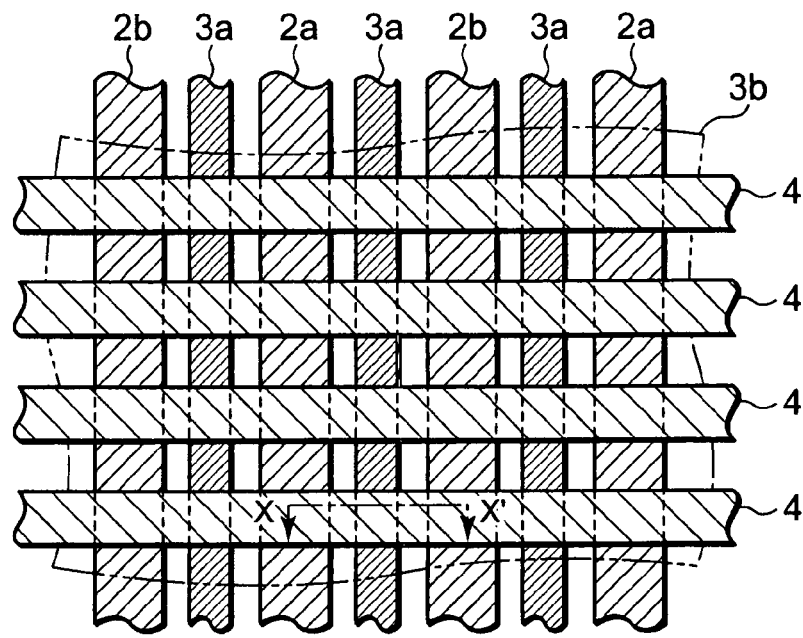
FIG. 1 is a partial plan view schematically showing a configuration of a non-volatile memory cell included in a semiconductor memory device according to Embodiment 1 of the present invention.
Figure 2:
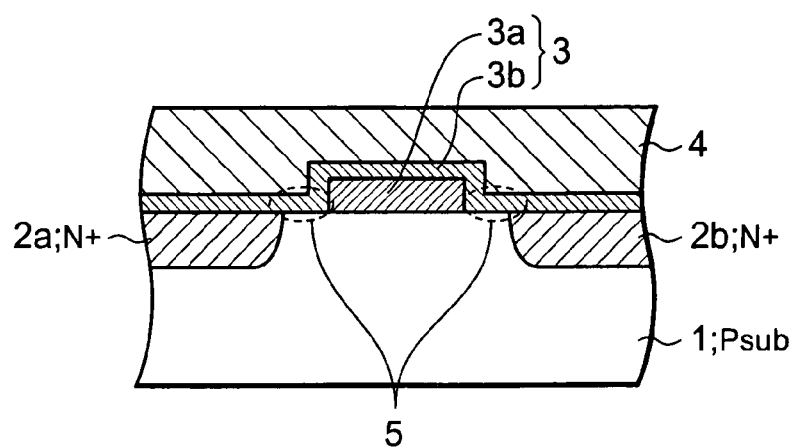
FIG. 2 is a partial cross-sectional view schematically showing the configuration of the non-volatile memory cell included in the semiconductor memory device according to Embodiment 1 of the present invention.

FIG. 1 is a partial plan view schematically showing a configuration of a non-volatile memory cell included in the semiconductor memory device according to Embodiment 1 of the present invention. FIG. 2 is a partial cross-sectional view schematically showing the configuration of the non-volatile memory cell included in the semiconductor memory device according to Embodiment 1 of the present invention.

The non-volatile memory cell included in the semiconductor memory device includes MIS transistors. Each of the MIS transistors includes: $n^+$ diffusion layers 2a and 2b, arranged at two sides of a part of a p-type semiconductor substrate 1 which is a channel region, for serving as source/drain regions; an insulating film 3a, arranged on the part of the semiconductor substrate 1 which is the channel region, for serving as a gate insulating film; a trap film 3b, arranged on surfaces of the semiconductor substrate 1, the $n^+$ diffusion layers 2a and 2b, and the insulating film 3a; and a gate electrode 4 arranged on the trap film 3b.

The semiconductor substrate 1 has a structure in which the surface of the channel region between the $n^+$ diffusion layers 2a and 2b in each MIS transistor is flat so that neither a step nor a concave exists there. The $n^+$ diffusion layers 2a and 2b are formed in the semiconductor substrate 1, and extend in a first direction (in the vertical direction in FIG. 1). The gate electrode 4 is arranged above areas where the $n^+$ diffusion layers 2a and 2b are arranged, and above areas of the channel region where no insulating film 3a is arranged, with the trap film 3b interposed in between. The gate electrode 4 extends in a second direction orthogonal to the first direction (in the horizontal direction in FIG. 1).

The insulating film 3a is one of a single-layered insulating film and a laminated insulating film which have an extremely lower electrons trapping characteristic than the trap film 3b. For example, a silicon oxide film may be used for the insulating film 3a. The insulating film 3a is arranged on the part of the semiconductor substrate 1 which is the channel region, and is arranged on none of the n⁺ diffusion layers 2a and 2b. The insulating film 3a is arranged in the central portion of the channel region in order that the trap film 3b can be in contact with the part of the semiconductor substrate 1 which is the channel region. For the purpose of securing a step of the trap film 3b, the film thickness of the insulating film 3a is set depending on the size of the MIS transistor in a way that the insulating film 3a is thicker than at least the trap film 3b (in a case where the trap film 3b has a laminated structure, the insulating film 3a is thicker in film thickness than a film having an electrons trapping characteristic out of the films constituting the trap film 3b) For example, the insulating film may be 5 nm to 100 nm in thickness. The insulating film 3a juts out from the level surface of the semiconductor substrate 1. In addition, the insulting film 3a covers parts of the channel region, and extends in the first direction (in the vertical direction in FIG. 1).

The trap film 3b is a single-layered insulating film made of an insulating material which has an electron trapping characteristic, or a laminated insulating film obtained by superposing multiple insulating films of different types. For example, an ONO film obtained by superposing a silicon oxide film, a silicon nitride film and a silicon oxide film in the sequence may be used for the trap film 3b. The trap film 3b is in contact with the part of the semiconductor substrate 1 which is the channel region, and in contact with the n⁺ diffusion layers 2a and 2b. The trap film 3b covers the top and side surfaces of the insulating film 3a. Areas of the trap film 3b, which are in contact with the semiconductor substrate 1, and which are concurrently in contact with parts of the n⁺ diffusion layers 2a and 2b in a vicinity of the channel region, are trap regions 5 for trapping electrons during a write operation. An area between the trap regions 5 has a structure in which the insulating film 3a and the trap film 3b are laminated.

Areas of the trap film 3b which are in contact with the semiconductor substrate 1 have step parts which bend upward (for example, vertically, obliquely upward) from the surface of the semiconductor substrate due to the insulating film 3a. The trap film 3b covers the n⁺ diffusion layers 2a and 2b, the insulating film 3a, and parts of the channel region which are not covered with the insulating film 3a.

Descriptions will be provided next for how the semiconductor memory device according to Example 1 of the present invention operates.

In a case where data is going to be written in a trap region 5 at the side of the n⁺ diffusion layer 2b, a positive voltage is applied to the n⁺ diffusion layer 2a, and the gate electrode 4 is thus floated (FLOAT, open). Concurrently, a ground potential is applied to the n⁺ diffusion layer 2b. Thereby, parts of electrons are trapped by the trap region 5 at the side of the n⁺ diffusion layer 2b while the electrons are flowing from the n⁺ diffusion layer 2a to the n⁺ diffusion layer 2b. This is a condition in which the data is written in the trap region 5 at the side of the n⁺ diffusion layer 2b.

In a case where data is going to be written in the trap region 5 at the side of the n⁺ diffusion layer 2a, the positive voltage is applied to n⁺ diffusion layer 2b, and the gate electrode 4 is thus floated (FLOAT, open). Concurrently, the ground potential is applied to n⁺ diffusion layer 2a. Thereby, parts of electrons are trapped by the trap region 5 at the n⁺ diffusion layer 2a while the electrons are flowing from the n⁺ diffusion layer 2b to the n⁺ diffusion layer 2a. This is a condition in which the data is written in the trap region 5 at the side of n⁺ diffusion layer 2a.

In a case where data is going to be read out, the positive voltage is applied to n⁺ diffusion layer 2a, and the positive voltage is applied to the gate electrode 4. Thereby, a potential condition of the n⁺ diffusion layer 2b is outputted depending on a condition in which data has been written in the trap regions 5, and the data is accordingly read out.

Figure 3A:
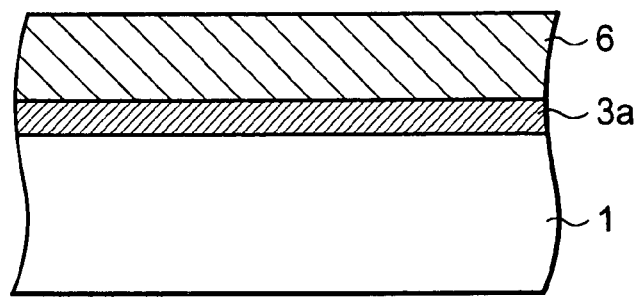
FIG. 3A to 3C are a first step cross-sectional view schematically showing a method of manufacturing the non-volatile memory cell included in the semiconductor memory device according to Embodiment 1 of the present invention.

Descriptions will be provided next for a method of manufacturing the semiconductor memory device according to Embodiment 1 of the present invention by use of the drawings. FIGS. 3 to 5 are step cross-sectional views each schematically showing the method of manufacturing a volatile memory cell included in the semiconductor memory device according to Embodiment 1 of the present invention.

First of all, the insulating film 3a (for example, a silicon oxide film) is formed on the entire top surface of the semiconductor substrate 1. Thereafter, a hard mask 6 (for example, a silicon nitride film) is formed on the entire top surface of the insulating film 3a (in step A1; see FIG. 3A).

Figure 3B:
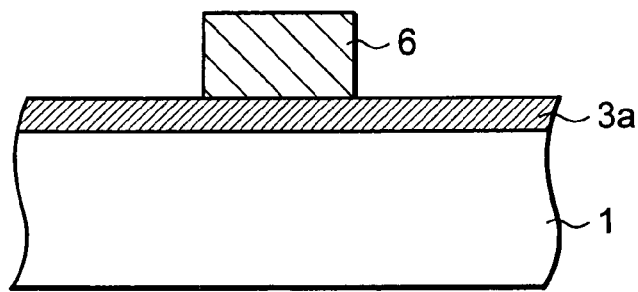

Next, predetermined parts of the hard mask 6 (parts corresponding to areas where the insulating film 3a is not formed in FIG. 2) are removed by etching (in step A2; see FIG. 3B). In this respect, the hard mask 6 is capable of being etched as follows. A resist (not illustrated) is applied to the nitride film, and the resultant resist is exposed and developed by use of a predetermined reticle. Subsequently, patterned parts of the resist are formed. Parts of the hard mask 6 exposed to the outside through the pattern parts of the resist are selectively removed by etching technique.

Figure 3C:
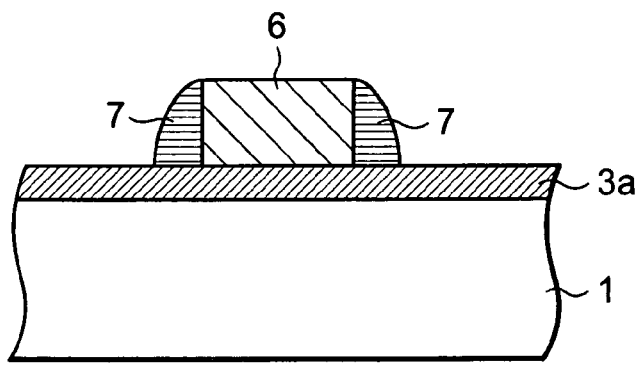

Afterward, sidewalls (for example, made of polysilicon) are formed at two sides of the hard mask 6 (in step A3; see FIG. 3C). In this respect, the sidewalls are capable of being formed by depositing silicon on the entire surface of the resultant substrate by CVD (Chemical Vapor Deposition) or the like, and subsequently by etching back the silicon film.

Figure 4A:
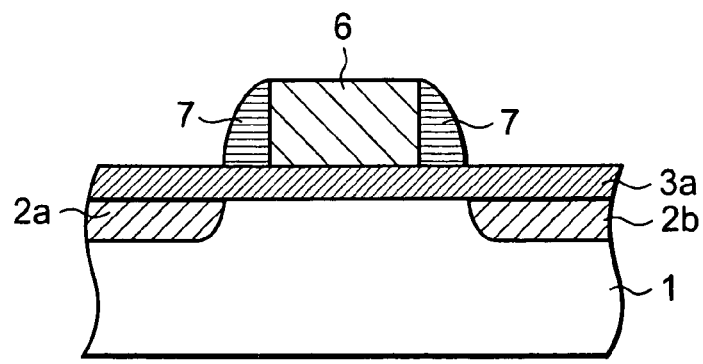
FIG. 4A to 4C are a second step cross-sectional view schematically showing the method of manufacturing a non-volatile memory cell included in the semiconductor memory device according to Embodiment 1 of the present invention.
Figure 4B:
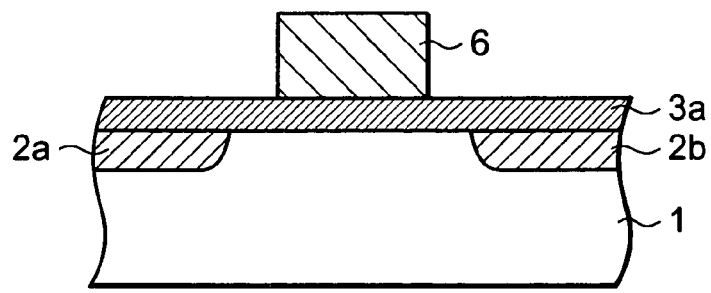
Figure 4C:
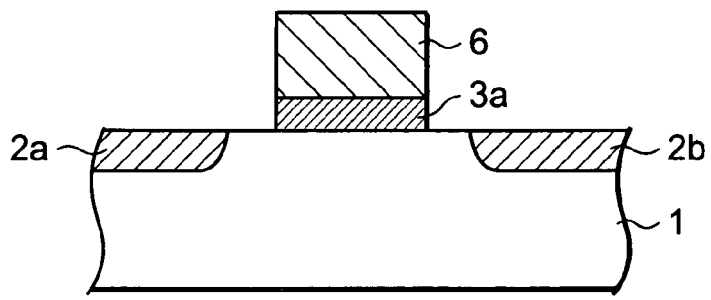
Figure 5A:
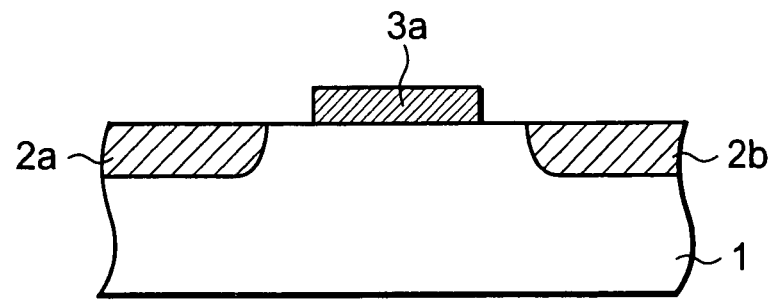
FIG. 5A to 5C are a third step cross-sectional view schematically showing the method of manufacturing the non-volatile memory cell included in the semiconductor memory device according to Embodiment 1 of the present invention.
Figure 5B:
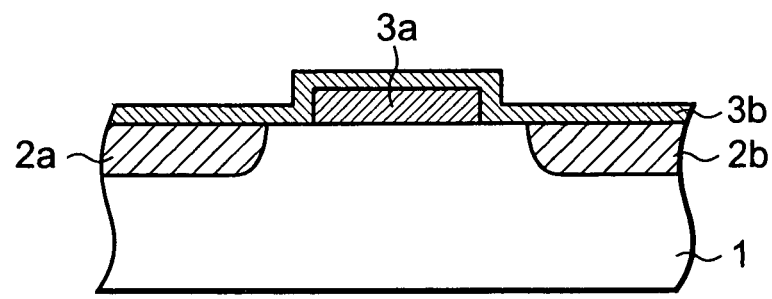
Figure 5C:
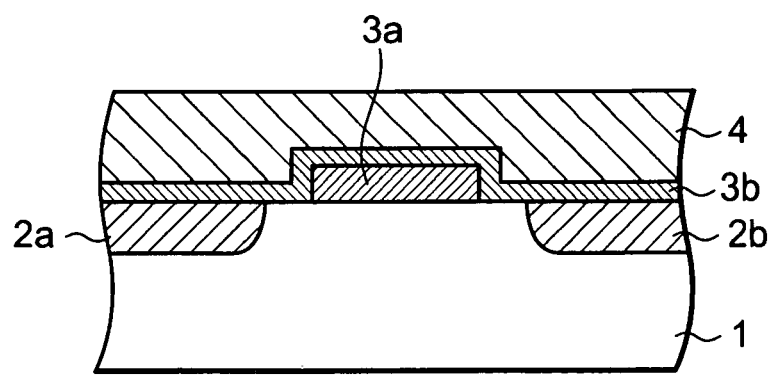

Subsequently, the n⁺ diffusion layers 2a and 2b are formed by injecting an impurity into parts of the semiconductor substrate 1 which are at two sides of the channel region by using the hard mask 6 and the sidewalls 7 as a mask (in step A4; see FIG. 4A). Thereafter, the sidewalls (denoted by reference numeral 7 in FIG. 4A) are selectively removed (in step A5; see FIG. 4B). Afterward, exposed parts of the insulating film 3a are removed by etching by using the hard mask 6 as a mask (in step A6; see FIG. 4C).

After that, the hard mask (denoted by reference numeral 6 in FIG. 4C) is selectively removed (in step A7; see FIG. 5A) Thereby, parts of the semiconductor substrate 1 are exposed to the outside through an area between the n⁺ diffusion layer 2a and the insulating film 3a, and between an area between the n⁺ diffusion layers 2b and the insulating film 3a. Subsequently, the trap film 3b (for example, formed of an ONO film) is formed on the entire surface of the resultant substrate (in step A8; see FIG. 5B). Thereafter, the gate electrode 4 is formed on the entire surface of the resultant substrate (in step A9; see FIG. 5C). Thereby, the MIS transistor shown in FIG. 2 is completed.

Embodiment 1 does not allow electrons to be trapped by the insulating film 3a during a write operation which traps electrons in the trap regions 5 (no matter what method may be employed for the write operation). This makes it possible to prevent electrons at the two trap regions from interfering with each other. As a result, the miniaturization and higher reliability can be realized.

Figure 6:
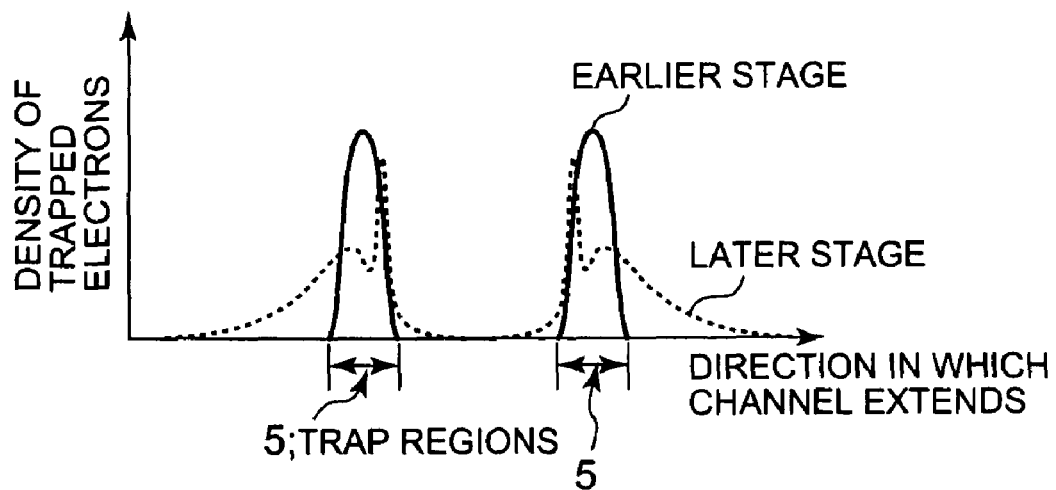
FIG. 6 is a graph showing density of trapped electrons relative to locations of a trap film in a direction in which the channel region extends, the trap film being in the non-volatile memory cell included in the semiconductor memory device according to Embodiment 1 of the present invention.
Figure 7:
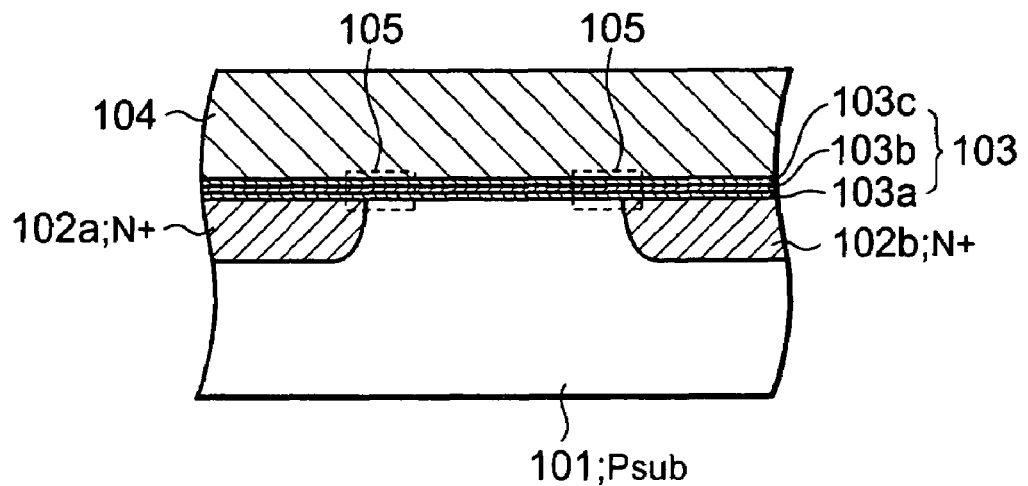
FIG. 7 is a partial cross-sectional view schematically showing a configuration of a non-volatile memory cell included in a semiconductor memory device according to Example 1.
Figure 8:
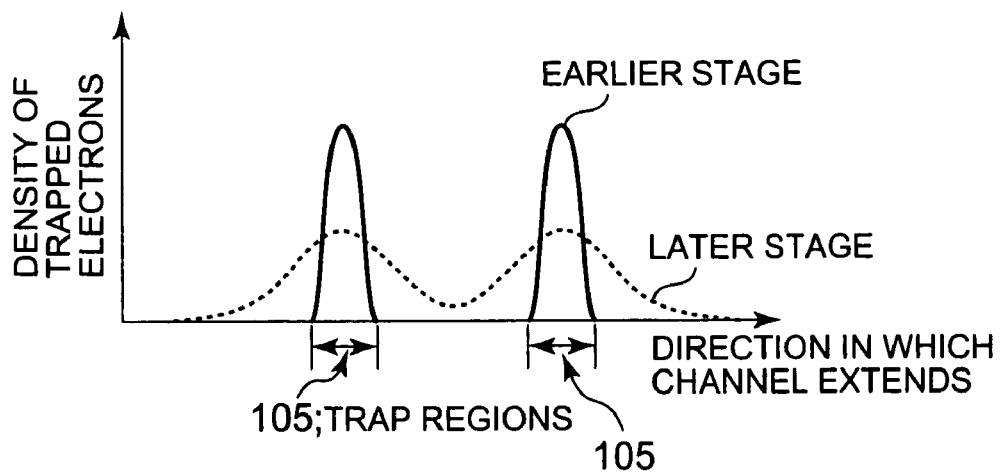
FIG. 8 is a graph showing density of trapped electrons relative to locations of the trap film in the direction in which the channel region extends, the trap film being in the non-volatile memory cell included in the semiconductor memory device according to Embodiment 1 of the present invention.
Figure 9:
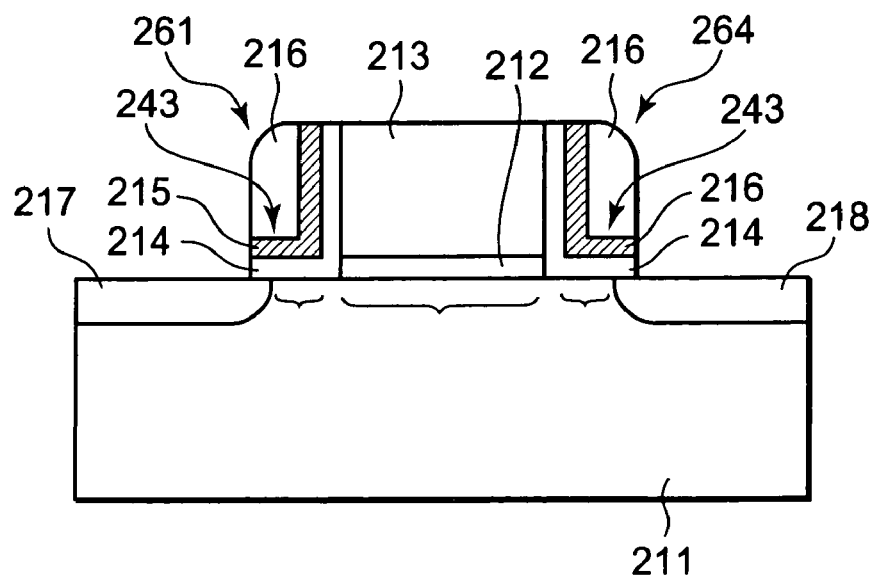
FIG. 9 is a partial cross-sectional view schematically showing a configuration of a non-volatile memory cell according to Example 2.
Figure 10:
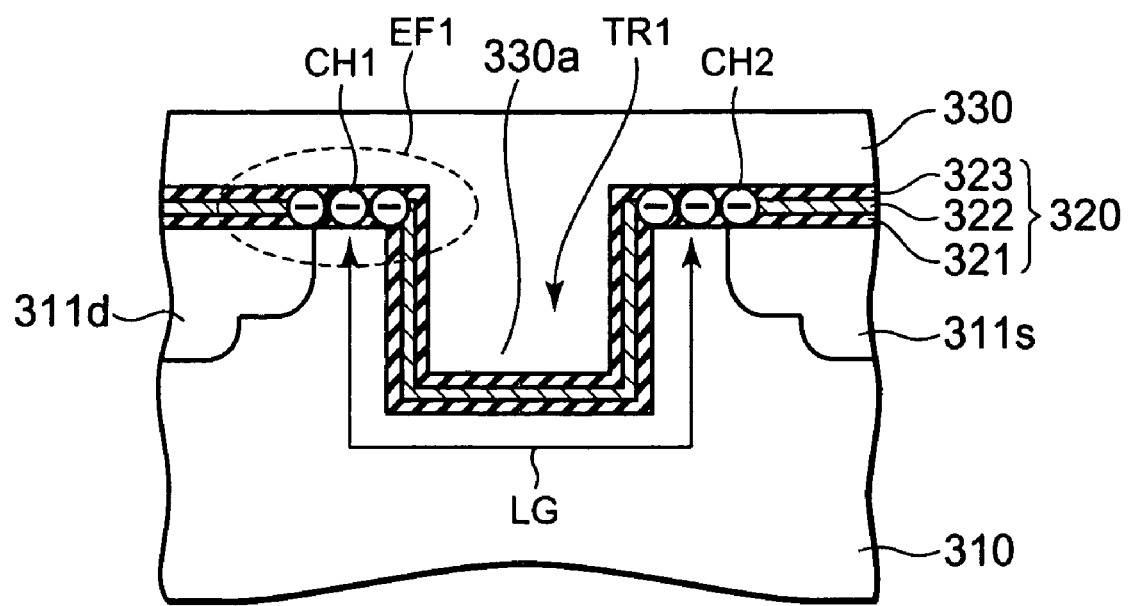
FIG. 10 is a partial cross-sectional view schematically showing a configuration of a non-volatile memory cell according to Example 3.

Moreover, while trapped electrons are diffusing due to heat or the like, the step part of each of the trap regions 5 in the trap film 3b is capable of checking the electrons from diffusing to the center of the channel region. Density of electrons trapped in the trap regions 5 becomes lower in this case than immediately after the write operation (in an earlier stage) as well. However, electrons corresponding to the lowered density are localized in the step part in each of the trap regions 5. As a result, these trap regions 5 are capable of causing less fluctuation in the threshold voltage than trap regions each with a flat structure (see FIG. 6). This makes it possible to realize a higher long-term reliability.

In addition, the present invention does not bring about a disadvantage of the deterioration of the electric current driving capability or the like. That is because the gate electrode overlaps the entire trap regions 5.

The above mentioned embodiments includes at least the aspect claiming a method of forming a semiconductor memory device, as below:

A method of manufacturing a semiconductor memory device, comprising:

forming an insulating film on an entire surface of a semiconductor substrate;

forming a hard mask in a predetermined location on the insulating film;

forming sidewalls at two sides of the hard mask;

forming diffusion layers by injecting an impurity into the semiconductor substrate with the hard mask and the sidewalls used as a mask;

selectively removing the sidewalls after forming the diffusion layers;

removing exposed parts of the insulating film by etching with the hard mask used as a mask after removing the sidewalls;

selectively removing the hard mask after removing the parts of the insulating film by etching;

forming a trap film on an entire surface of the resultant substrate after removing the hard mask; and forming a gate electrode on an entire surface of the resultant substrate after forming the trap film.

We might file a continuation application with the amendment prepared based on the above method aspect.

What is claimed is:

1. A semiconductor memory device, comprising:
    a semiconductor substrate in which a channel region is formed;
    a plurality of diffusion layers arranged at two sides of the channel region, as source/drain regions;
    a trap film made of an insulating material having an electrons trapping characteristic, the trap film having first and second portions thereof, said first and second portions being other than parallel and being coupled at an edge portion, said edge portion being formed over said channel region; and
    a gate electrode arranged over the trap film; and
    wherein the gate electrode is arranged above areas where the diffusion layers are arranged, and above parts of the channel region where no insulating film is arranged, with the trap film interposed in between.

2. The semiconductor memory device as claimed in claim 1, wherein an area between trap regions of the trap film at two sides of an insulating film arranged on a part of the channel region includes a structure in which the insulating film and the trap film are superposed on the semiconductor substrate in this sequence.

3. The semiconductor memory device as claimed in claim 1, wherein an electrons trapping characteristic of an insulating film arranged on a part of the channel region is lower than that of the trap film.

4. The semiconductor memory device as claimed in claim 1, wherein the trap film has a structure in which the trap film is bent upward from a surface of the semiconductor substrate in trap regions of the trap film due to an insulating film arranged on a part of the channel region.

5. The semiconductor memory device as claimed in claim 1, wherein an insulating film arranged on a part of the channel is at least thicker in film thickness than the trap film.

6. The semiconductor memory device as claimed in claim 1, wherein
    the trap film comprises a laminated insulating film obtained by superposing a plurality of insulating films of different types, and
    the trap film is thicker in film thickness than an insulating film having an electron trapping characteristic out of the plurality of insulating films in the trap film.

7. The semiconductor memory device as claimed in claim 1,
    wherein said trap film comprises an insulating film formed over said source and said channel regions, said insulating film comprising said first portion and said second portion, a distance between said source region and said first portion being closer than a distance between said source region and said second portion and
    a distance between said first portion and said channel region being different from a distance between said second portion and said channel region due to an overlapping of said first and second portions over said channel region, as caused by said first portion and said second portion being other than parallel.

* * * * *